United States Patent
Xu et al.

(10) Patent No.: US 9,570,325 B2
(45) Date of Patent: Feb. 14, 2017

(54) PACKAGED SEMICONDUCTOR DEVICES HAVING RIBBON WIRES

(71) Applicant: FREESCALE SEMICONDUCTOR, INC., Austin, TX (US)

(72) Inventors: Liqiang Xu, Tianjin (CN); Qingchun He, Tianjin (CN); Peng Liu, Tianjin (CN); Hanmin Zhang, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/738,937

(22) Filed: Jun. 15, 2015

(65) Prior Publication Data

US 2016/0190086 A1 Jun. 30, 2016

(30) Foreign Application Priority Data

Dec. 29, 2014 (CN) .......................... 2014 1 0858361

(51) Int. Cl.
*H01L 23/495* (2006.01)
*H01L 21/56* (2006.01)
*H01L 23/31* (2006.01)
*H01L 23/00* (2006.01)

(52) U.S. Cl.
CPC ......... *H01L 21/568* (2013.01); *H01L 23/3121* (2013.01); *H01L 23/49541* (2013.01); *H01L 23/49548* (2013.01); *H01L 24/48* (2013.01); *H01L 24/85* (2013.01); *H01L 23/4951* (2013.01); *H01L 24/45* (2013.01); *H01L 2224/45014* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/48091* (2013.01); *H01L 2224/48455* (2013.01); *H01L 2224/83001* (2013.01); *H01L 2224/85001* (2013.01); *H01L 2224/92247* (2013.01); *H01L 2924/181* (2013.01); *H01L 2924/18165* (2013.01)

(58) Field of Classification Search
CPC .... H01L 24/43; H01L 21/568; H01L 23/3114; H01L 21/6835; H01L 23/49568; H01L 23/3675; H01L 21/565; H01L 23/49541; H01L 23/49838
See application file for complete search history.

(56) References Cited

U.S. PATENT DOCUMENTS

| | | | |
|---|---|---|---|
| 7,135,761 B2 | 11/2006 | Carney et al. | |
| 2002/0027265 A1* | 3/2002 | Yoneda | ................ H05K 3/3442 257/666 |
| 2005/0133824 A1* | 6/2005 | Hosokawa | .......... H01L 21/4832 257/200 |

(Continued)

*Primary Examiner* — Thanh Y Tran
(74) *Attorney, Agent, or Firm* — Charles E. Bergere

(57) ABSTRACT

A packaged semiconductor device, such as a power QFN device, has (rectangular) ribbon wires, instead of circular bond wires. A proximal end of each ribbon wire is connected to a pad on an IC die, and a distal end of each ribbon wire forms a device lead. The die and the ribbon wires are encapsulated in a molding compound with a side of each device lead exposed. Such devices can be assembled without using lead frames. The omission of lead frames and the use of ribbon wires enable assembly of smaller devices having enhanced thermal dissipation capabilities.

10 Claims, 2 Drawing Sheets

100

(56) References Cited

U.S. PATENT DOCUMENTS

| | | | |
|---|---|---|---|
| 2007/0134845 A1* | 6/2007 | Kato | H01L 21/568 |
| | | | 438/111 |
| 2011/0024745 A1* | 2/2011 | Hembree | G01R 1/06716 |
| | | | 257/48 |
| 2014/0191381 A1* | 7/2014 | Lee | H01L 23/49537 |
| | | | 257/676 |

* cited by examiner

PACKAGED SEMICONDUCTOR DEVICES HAVING RIBBON WIRES

BACKGROUND

The present invention relates to semiconductor devices and semiconductor packaging and, more particularly, to a semiconductor device assembled using ribbon wires.

Packaged semiconductor devices, especially so-called power devices, have integrated circuit (IC) dies that generate heat that must be removed to prevent damage to the device. Conventional power devices are assembled using lead frames, where the die is mounted on a lead frame flag and then electrodes of the die are connected with leads of the lead frame with bond wires. The leads then provide for electrical interconnection of the die with signals outside of the packaged device. It would be advantageous to be able to package an ID die without the use of a lead frame and have a package with good heat dissipating quality.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1A:
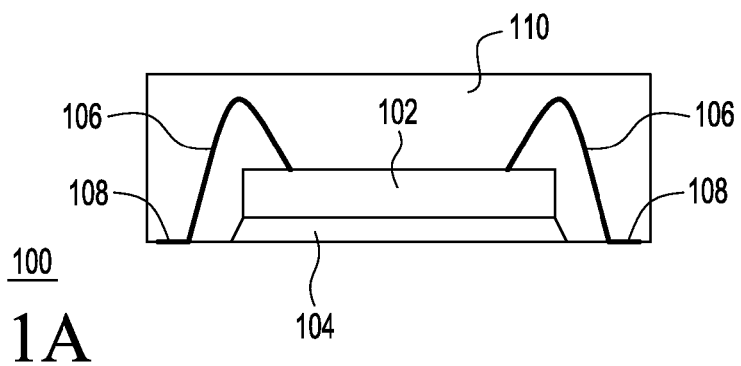
FIG. 1A is a cross-sectional side view of a packaged semiconductor device according to one embodiment of the invention.

FIG. 1A is a cross-sectional side view of a packaged semiconductor device 100 according to one embodiment of the invention. The device 100 is a QFN (quad flat no-lead) device. In certain implementations, the QFN device 100 is a power QFN (PQFN) device.

As shown in FIG. 1A, the device 100 has an IC die 102 connected to a die pad 104 that comprises a conducting or insulating element. In some implementations, the die pad 104 is conductive or insulating paste or tape. In other implementations, the die pad 104 is a heat sink (which comprise a metal slug, as is known in the art). Connected to die bonding pads or electrodes (not shown) on the top side of the die 102 are multiple ribbon wires 106. One end (i.e., the proximal end) of each ribbon wire 106 is bonded to a die pad, while the other end (i.e., the distal end) of each ribbon wire 106 forms a lead 108 of the packaged device 100. As such, each ribbon wire 106 functions as both (i) the interconnect wire between the die 102 and the corresponding device lead 108 and (ii) the corresponding device lead 108 itself.

Conventional bond wires used in packaged semiconductor devices have a circular lateral cross-section. Ribbon wires, on the other hand, have a rectangular lateral cross-section, where the width of a ribbon wire is greater than its thickness. Ribbon wires are made of any suitable conductive material such as gold, aluminum, silver, palladium, copper, and combinations thereof. In one embodiment, each ribbon wire 106 has a width of about 200 microns and a thickness of about 50 microns. In general, the ribbon wires 106 can have widths from about 25 microns to about 2000 microns and thicknesses from about 12 microns to about 200 microns. Such ribbon wire is flexible and can be attached to the die electrodes using known wedge bonding techniques. Ribbon wire is available, for example, from Heraeus Materials Technology GmbH & Co. of Hanau, Germany.

The die 102, die pad 104, and ribbon wires 106 are encapsulated within a suitable molding compound 110 such that (1) the bottom side of the die pad 104 and the bottom side of each ribbon-wire lead 108 are exposed at the bottom side of the packaged device 100. Note that, for packaged devices in which the die pad 104 is omitted, the bottom side of the die 102 will be exposed at the bottom side of the packaged device.

Figure 1B:
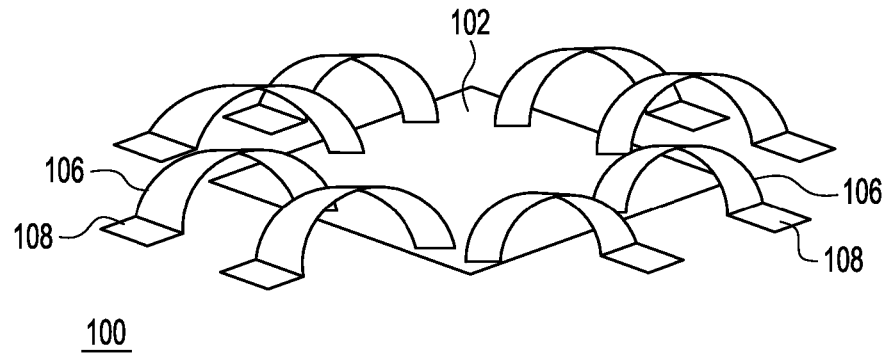
FIG. 1B is an isometric view of the ribbon wires of the device of FIG. 1A.

FIG. 1B is an isometric view of the ribbon wires 106 connected at their proximal ends to the die 102 and forming the leads 108 at their distal ends. Although the device 100 has two ribbon wires 106 forming two corresponding leads 108 on each side of the device 100, in general, embodiments of the invention can have one or more ribbon wires forming one or more corresponding leads on one or more sides of the device, with either the same or different numbers of ribbon wires and leads on different sides of the device.

Figure 1C:
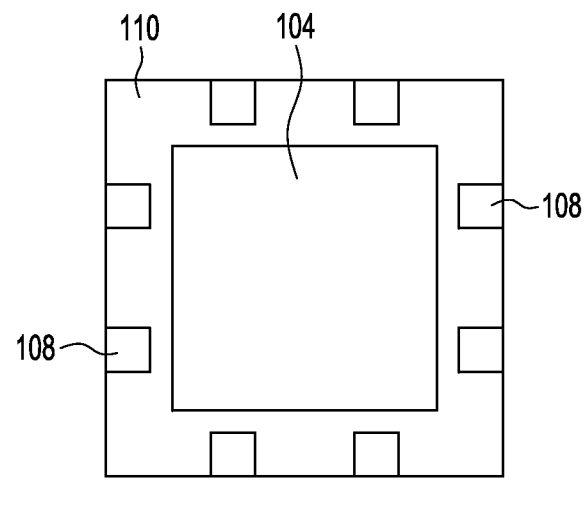
FIG. 1C is a plan view of the bottom side of the device of FIG. 1A.

FIG. 1C is a plan view of the bottom side of the packaged device 100 showing the ribbon-wire leads 108 and the bottom side of the die pad 104 exposed through the molding compound 110.

FIGS. 2A-2F are cross-sectional side views illustrating different stages of a method for assembling the packaged device 100 of FIGS. 1A-1C. The method starts at FIG. 2A with a substrate 202 made of glass or other suitable material for providing support during the assembly process.

Figure 2A:
FIGS. 2A-2F are cross-sectional side views illustrating different stages in a method for assembling the packaged device of FIGS. 1A-1C.
Figure 2B:
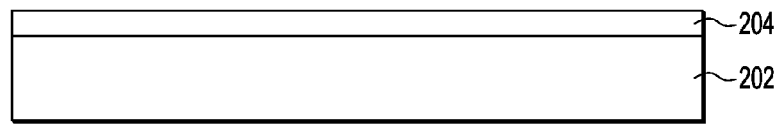

FIG. 2B illustrates the application of a suitable adhesive 204 in either tape or paste form onto the top side of the substrate 202.

Figure 2C:
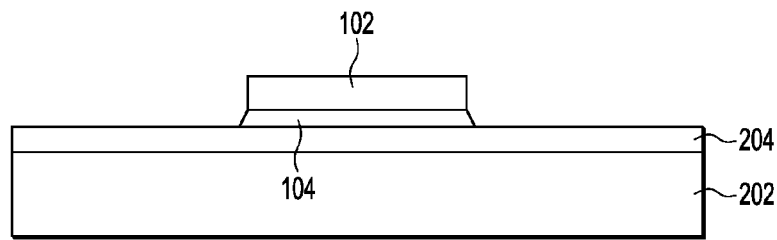

FIG. 2C illustrates the mounting of a sub-assembly comprising the die 102 and the conducting or insulating element 104, onto the adhesive 204. Note that, for alternative embodiments in which the die pad 104 is omitted, the die 102 is mounted directly onto the adhesive 204.

Figure 2D:
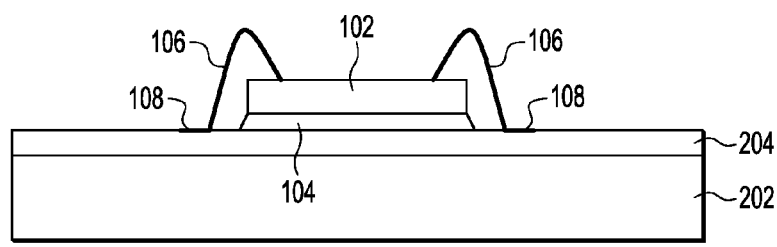

FIG. 2D represents the application of the ribbon wires 106 in which (i) the proximal end of each ribbon wire 106 is bonded to a die bonding pad (not shown) on the top, active side of the die 102 and (ii) the distal end of each ribbon wire 106 is pressed onto the adhesive 204 to form a corresponding device lead 108. The ribbon wires 106 may be connected or attached to the die bonding pads using commercially available wire bonding equipment.

Figure 2E:
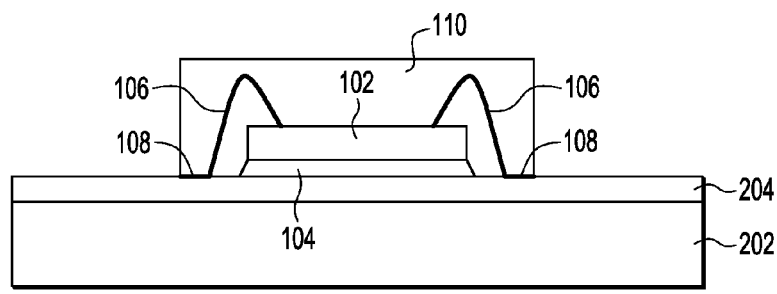

FIG. 2E represents the application of the molding compound 110 to encapsulate the die 102, the element 104, and the ribbon wires 106.

Figure 2F:

FIG. 2F represents the removal of the substrate 202 and the adhesive 204 to provide the packaged device 100 of FIGS. 1A-1C. Note that FIG. 2F is identical to FIG. 1A. In some implementations, the substrate 202 and the adhesive 204 are removed using UV radiation.

Because the packaged device 100 has no lead frame and is assembled without using a lead frame, the lateral dimensions of the packaged device 100 can be less than the lateral dimensions of comparable packaged devices that do have lead frames and/or are assembled using lead frames. Moreover, since the bonded ribbon wires 106 can be configured with a lower profile (e.g., shorter wire length and lower loop height) than conventionally bonded circular bond wires, the height of the packaged device 100 can be less than the height of comparable packaged devices having circular bond wires. Furthermore, since the cross-sectional areas of the ribbon wires 106 are significantly larger than the cross-sectional areas of conventional circular bond wires, and since the lengths of the ribbon wires 106 can be shorter than the lengths of conventional bond wires, the packaged device 100 can have enhanced heat dissipation capabilities compared with conventional packaged devices.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims. The Abstract included in this specification is provided with the understanding that it will not be used for claim construction.

The invention claimed is:

1. A method for assembling a packaged semiconductor device, the method comprising:
   (a) mounting a die onto a substrate using an adhesive;
   (b) bonding a plurality of ribbon wires between the die and the adhesive, wherein:
      (b1) a proximal end of each ribbon wire is connected to a bonding pad of the die; and
      (b2) a distal end of each ribbon wire is connected to the adhesive;
   (c) applying molding compound to encapsulate the die and the plurality of ribbon wires; and
   (d) removing the substrate and the adhesive to expose a side of the distal end of each ribbon wire to form a lead of the device.

2. The method of claim 1, wherein no lead frame is used to assemble the device.

3. The method of claim 1, wherein removing the substrate also exposes a bottom side of the die.

4. The method of claim 1, wherein the device is a Quad Flat No Lead (QFN) device.

5. The method of claim 1, wherein the device is a power device.

6. The method of claim 1, wherein:
   mounting the die on the substrate comprises mounting the die having a conducting or insulating element attached to a bottom side of the die; and
   removing the substrate exposes a bottom side of the conducting or insulating element.

7. The packaged semiconductor device assembled using the method of claim 6.

8. The method of claim 1, wherein the device is a power QFN device.

9. The packaged semiconductor device assembled using the method of claim 1.

10. The method of claim 1, wherein connecting the distal end of each ribbon wire to the adhesive comprises pressing a bottom side of the distal end of each ribbon wire into the adhesive.

* * * * *